(12) United States Patent
Siddiqui et al.

(10) Patent No.: US 11,888,048 B2
(45) Date of Patent: Jan. 30, 2024

(54) GATE OXIDE FOR NANOSHEET TRANSISTOR DEVICES

(71) Applicant: International Business Machines Corporation, Armonk, NY (US)

(72) Inventors: Shahab Siddiqui, Clifton Park, NY (US); Koji Watanabe, Yokohama (JP); Charlotte DeWan Adams, Schenectady, NY (US); Kai Zhao, Albany, NY (US); Daniel James Dechene, Albany, NY (US); Rishikesh Krishnan, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/521,964

(22) Filed: Nov. 9, 2021

(65) Prior Publication Data

US 2022/0069104 A1 Mar. 3, 2022

Related U.S. Application Data

(62) Division of application No. 16/742,295, filed on Jan. 14, 2020, now Pat. No. 11,211,474.

(51) Int. Cl.
*H01L 29/66* (2006.01)
*H01L 29/417* (2006.01)
(Continued)

(52) U.S. Cl.
CPC ...... *H01L 29/6675* (2013.01); *H01L 21/0259* (2013.01); *H01L 21/823431* (2013.01);
(Continued)

(58) Field of Classification Search
CPC ............ H01L 29/6675; H01L 21/0259; H01L 21/823431; H01L 29/41733; H01L 29/42384; H01L 29/7869; H01L 29/78696; H01L 29/42392; H01L 27/0688; Y10S 977/938
See application file for complete search history.

(56) References Cited

U.S. PATENT DOCUMENTS 8,102,006 B2   1/2012  Zhou
8,492,228 B1   7/2013  Leobandung et al.
(Continued)

OTHER PUBLICATIONS

List of IBM Patents or Patent Applications Treated as Related.

*Primary Examiner* — Cuong B Nguyen
(74) *Attorney, Agent, or Firm* — Kimberly Zillig; Ryan, Mason & Lewis, LLP

(57) ABSTRACT

A method of forming a semiconductor structure includes forming a first nanosheet stack and a second nanosheet stack on a semiconductor substrate. The first nanosheet stack includes a plurality of alternating first sacrificial layers and first channel layers. The first sacrificial layers each define a first sacrificial height. The second nanosheet stack includes a plurality of alternating second sacrificial layers and second channel layers. The second sacrificial layers each define a second sacrificial height greater than the first sacrificial height of the first sacrificial layers. The method further includes removing the first and second sacrificial layers respectively from the first and second nanosheet stacks. A metal gate is deposited over the first and second nanosheet stacks to form respective first and second nanosheet transistor structures.

20 Claims, 14 Drawing Sheets

(51) Int. Cl.
*H01L 21/8234* (2006.01)
*H01L 29/786* (2006.01)
*H01L 21/02* (2006.01)
*H01L 29/423* (2006.01)

(52) U.S. Cl.
CPC .. *H01L 29/41733* (2013.01); *H01L 29/42384* (2013.01); *H01L 29/7869* (2013.01)

(56) References Cited

U.S. PATENT DOCUMENTS

| | | |
|---|---|---|
| 9,087,722 B2 | 7/2015 | Adams et al. |
| 9,536,794 B2 | 1/2017 | Chang et al. |
| 9,935,014 B1 | 4/2018 | Cheng et al. |
| 9,972,642 B2 | 5/2018 | Hafez et al. |
| 10,014,390 B1 | 7/2018 | Bouche et al. |
| 10,141,403 B1 | 11/2018 | Cheng et al. |
| 10,229,971 B1 | 3/2019 | Cheng et al. |
| 10,243,054 B1 | 3/2019 | Cheng et al. |
| 2021/0057541 A1 | 2/2021 | Huang et al. |

GATE OXIDE FOR NANOSHEET TRANSISTOR DEVICES

BACKGROUND

The present application relates to manufacturing of semiconductor integrated circuits, and, more particularly, relates to formation of field effect transistor (FET) devices in integrated circuits. Continued innovations in semiconductor process technologies are enabling higher integration densities and associated device scaling. As the semiconductor industry moves towards the 5 nanometer (nm) production node and beyond, FET devices must be scaled to smaller dimensions to provide an increased effective channel width per footprint area. Such scaling in some cases is achieved using nanosheet FET devices. A given nanosheet FET device comprises a channel which includes multiple nanosheet layers arranged in a stacked configuration, with each nanosheet layer having a vertical thickness that is substantially less than its width. A common gate structure is formed in areas above and below the nanosheet layers in the stacked configuration, thereby increasing the effective channel width of the resulting device, and thus the drive current supported thereby, for a given footprint area.

SUMMARY

Accordingly, illustrative embodiments of the present disclosure are directed to processes and techniques for use in fabrication of nanosheet FET structures.

In accordance with one illustrative embodiment, a method of forming a semiconductor structure comprises forming a first nanosheet stack and a second nanosheet stack on a semiconductor substrate. The first nanosheet stack comprises a plurality of alternating first sacrificial layers and first channel layers. The first sacrificial layers each define a first sacrificial height. The second nanosheet stack comprises a plurality of alternating second sacrificial layers and second channel layers. The second sacrificial layers each define a second sacrificial height greater than the first sacrificial height of the first sacrificial layers. The method further comprises removing the first and second sacrificial layers respectively from the first and second nanosheet stacks. A metal gate is deposited over the first and second nanosheet stacks to form respective first and second nanosheet transistor structures.

In accordance with another illustrative embodiment, a method for forming a semiconductor substrate comprises forming a first nanosheet stack and a second nanosheet stack on a semiconductor substrate. The first nanosheet stack comprises a plurality of alternating first sacrificial layers and first channel layers. The second nanosheet stack comprises a plurality of alternating second sacrificial layers and second channel layers. A number of the second sacrificial layers of the second nanosheet stack is less than a number of first sacrificial layers of the first nanosheet stack. The method further comprises removing the first and second sacrificial layers respectively from the first and second nanosheet stacks. A metal gate is deposited over the first and second nanosheet stacks to form respective first and second nanosheet transistor structures on the semiconductor substrate.

In accordance with another illustrative embodiment, a semiconductor device comprises a first nanosheet transistor structure and a second nanosheet transistor structure disposed on a semiconductor substrate. The first nanosheet transistor structure includes a first nanosheet stack having a first number of first channel layers with adjacent channel layers being spaced a first predetermined distance. The second nanosheet transistor structure includes a second nanosheet stack having a second number of second channel layers with adjacent channel layers being spaced a second predetermined distance. The first number of first channel layers of the first nanosheet transistor structure is greater than the second number of second channel layers of the second nanosheet transistor structure and the second predetermined distance is greater than the first predetermined distance.

These and other objects, features and advantages of the present disclosure will become apparent from the following detailed description of illustrative embodiments thereof, which is to be read in connection with the accompanying drawings.

DETAILED DESCRIPTION

Figure 1:
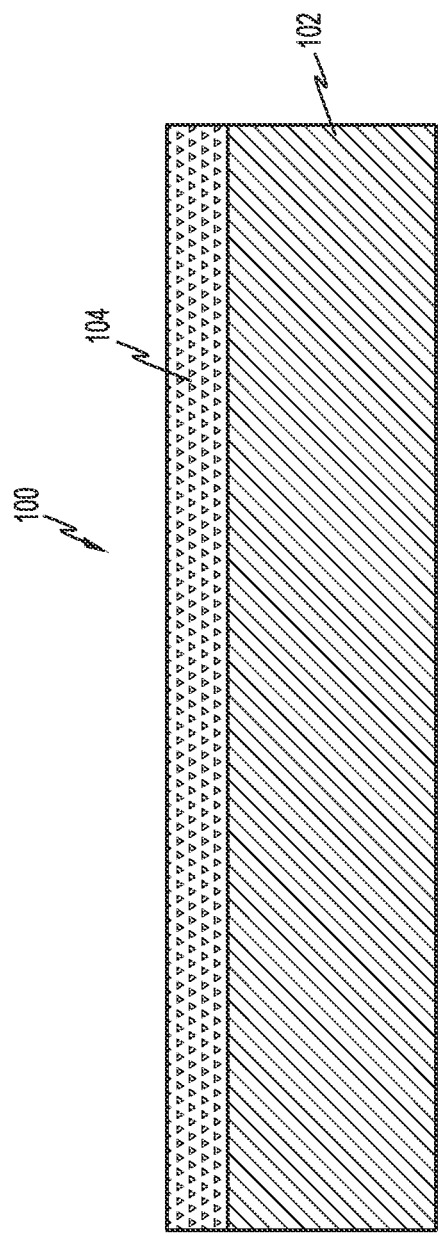
FIG. 1 is a cross-sectional view of a semiconductor structure illustrating a semiconductor substrate and a first oxide layer on the semiconductor substrate according to one or more illustrative embodiments.

Nanosheet technologies are considered to be a viable option for continued scaling of metal-oxide-semiconductor (MOS) devices, such as complementary MOS (CMOS) devices each comprising an n-type FET (NFET) and a p-type FET (PFET). However, problems can arise in the production of nanosheet device features, particularly, at production nodes below 5 nm. For example, one challenge of fabricating nanosheet FET devices is a lack of sufficient spacing between the individual nanosheets. The lack of sufficient spacing affects the deposition process of the high-k metal gate of the nanosheet devices resulting in undesired pinch-off amongst other issues. Moreover, spacing becomes an issue when multiple nanosheet transistors are formed on the same chip or wafer. While nanosheet transistors (FETs) and/or nanosheets can benefit from tight device-device spacing, these dimensions can limit device scaling. Further, devices requiring a thicker dielectric for a higher voltage operation are even more limited in the allowable dimensions. Higher voltage devices for input and/or output circuits of nanosheet transistors need thicker gate dielectrics as compared to standard gate devices, which have a lower voltage and can be employed, e.g., in logic devices. However, spacing between nanosheets needs to be small to realize capacitance benefits. The processes disclosed herein effectively maximize spacing for deposition of an increased volume of gate dielectric material to accommodate input and/or output devices of a nanosheet FET transistor structure.

It is understood in advance that although this description includes a detailed description of an illustrative nanosheet FET architecture having channel layers and sacrificial layers, implementation of the teachings recited herein are not limited to the particular FET architecture described herein. Rather, embodiments of the present invention are capable of being implemented in conjunction with any other type of FET device, including, for example, any nanosheet FET architectures and transistor structures.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto a semiconductor device. Available technologies include physical vapor deposition (PVD), chemical vapor deposition (CVD), electrochemical deposition (ECD), molecular beam epitaxy (MBE) and, more recently, atomic layer deposition (ALD) among others. Removal/etching is any process that removes material from the semiconductor structure. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to an underlying substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the substrate, for example, a wafer, is aligned to the previously formed patterns and slowly the conductors, insulators and selectively doped regions are built up to form the final device.

The various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, e.g., film deposition, removal/etching, semiconductor doping, patterning/lithography and annealing steps, are purposefully not described in great detail herein for economy of description.

Moreover, the same or similar reference numbers are used throughout the drawings to denote the same or similar features, elements, or structures, and thus, a detailed explanation of the same or similar features, elements, or structures will not be repeated for each of the drawings. The terms "about" or "substantially" as used herein with regard to thicknesses, widths, percentages, ranges, etc., are meant to denote being close or approximate to, but not exactly. For example, the term "about" or "substantially" as used herein implies that a small margin of error is present. Further, the terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or Y-direction of the Cartesian coordinates shown in the drawings.

Additionally, the term "illustrative" is used herein to mean "serving as an example, instance or illustration." Any embodiment or design described herein is intended to be "illustrative" and is not necessarily to be construed as preferred or advantageous over other embodiments or designs. The term "connection" can include both an indirect "connection" and a direct "connection." The terms "on" or "onto" with respect to placement of components relative to the semiconductor structure are not to be interpreted as requiring direct contact of the components for it is possible one or more intermediate components, layers or coatings may be positioned between the select components unless otherwise specified. More specifically, positional relationships, unless specified otherwise, can be direct or indirect, and the present disclosure is not intended to be limiting in this respect.

As previously noted herein, for the sake of brevity, conventional techniques related to semiconductor device and integrated circuit (IC) fabrication may or may not be described in detail herein. Although specific fabrication operations used in implementing one or more embodiments of the present disclosure can be individually known, the described combination of operations and/or resulting structures of the present disclosure are unique. Thus, the unique combination of the operations described in connection with the fabrication of a semiconductor structure including a nanosheet FET transistor structure of a device according to illustrative embodiments utilizes a variety of individually known physical and chemical processes performed on a semiconductor (e.g., silicon) substrate, some of which are described in the immediately following paragraphs.

In the discussion that follows, the semiconductor device, which will incorporate one or more nanosheet FET transistor structures or devices, will be referred to as the "semiconductor structure 100" throughout the various stages of fabrication, as represented in all the accompanying drawings. In addition, the following discussion will identify various intermediate stages of fabrication of the semiconductor structure 100. It is to be understood that the intermediate stages are exemplative only. More or less intermediate stages may be implemented in processing the semiconductor structure 100, and the disclosed stages may be in different order or sequence. In addition, one or more processes may be incorporated within various intermediate stages as described herein, and one or more processes may be implemented in intermediate stages as otherwise described herein.

FIGS. 1-14 illustrate a manufacturing or fabrication process for a semiconductor structure 100 involving the formation of stacked nanosheet transistor structures of, for example, a CMOS device according to one illustrative embodiment of the present disclosure. In the embodiments illustrated in FIGS. 1-14, a pair of nanosheet transistor structures is fabricated onto a substrate and/or wafer. In illustrative embodiments, one of the nanosheet transistor structures will be a high voltage gate device for input and/or output circuits and the other will be a standard gate device incorporated in a lower voltage logic transistor structure. The process is applied to the semiconductor structure 100 in conjunction with the manufacture of integrated circuits.

FIG. 1 is a cross-sectional view of the semiconductor structure 100 at an early stage of fabrication. The semiconductor structure 100 includes a semiconductor substrate 102, which may be in the form of a substrate or wafer comprising a silicon (Si) material or other dielectric material, such as silicon oxide or silicon nitride. While the semiconductor substrate 102 is illustrated as a generic substrate layer, it is to be understood that the semiconductor substrate 102 may comprise one of different types of semiconductor substrate structures and materials. For example, in one embodiment, the semiconductor substrate 102 can be a bulk semiconductor substrate (e.g., wafer) that is formed of silicon (Si) or germanium (Ge), or other types of semiconductor substrate materials that are commonly used in bulk semiconductor fabrication processes such as a silicon-germanium alloy, compound semiconductor materials (e.g., III-V), etc. In another embodiment, the semiconductor substrate 102 may be an active semiconductor layer of an SOI (silicon-on-insulator) substrate, GeOI (germanium-on-insulator) substrate, or other type of semiconductor-on-insulator substrate, which comprises an insulating layer (e.g., oxide layer) disposed between a base substrate layer (e.g., silicon substrate) and the active semiconductor layer (e.g., Si, Ge, etc.) in which active circuit components are formed as part of, for example, a front end of line (FEOL) or a middle of line (MOL) device. In illustrative embodiments, the semiconductor substrate 102 may have a thickness of about 500 to 1000 micrometers (μm). The semiconductor substrate 102 may itself comprise multiple layers, although it is shown as a single layer in the figures, again for clarity and simplicity of illustration.

The semiconductor substrate 102 has a first oxide layer 104 disposed on the surface of the semiconductor substrate 102. The first oxide layer 104 may include a silicon dioxide ($SiO_2$) "grown" on the semiconductor substrate by conventional means including thermal wet or thermal dry oxidation processes. The first oxide layer 104 is utilized for surface passivation, insulative properties and to minimize moisture and other atmospheric contaminants from penetrating into the surface of the semiconductor substrate 102.

Figure 2:
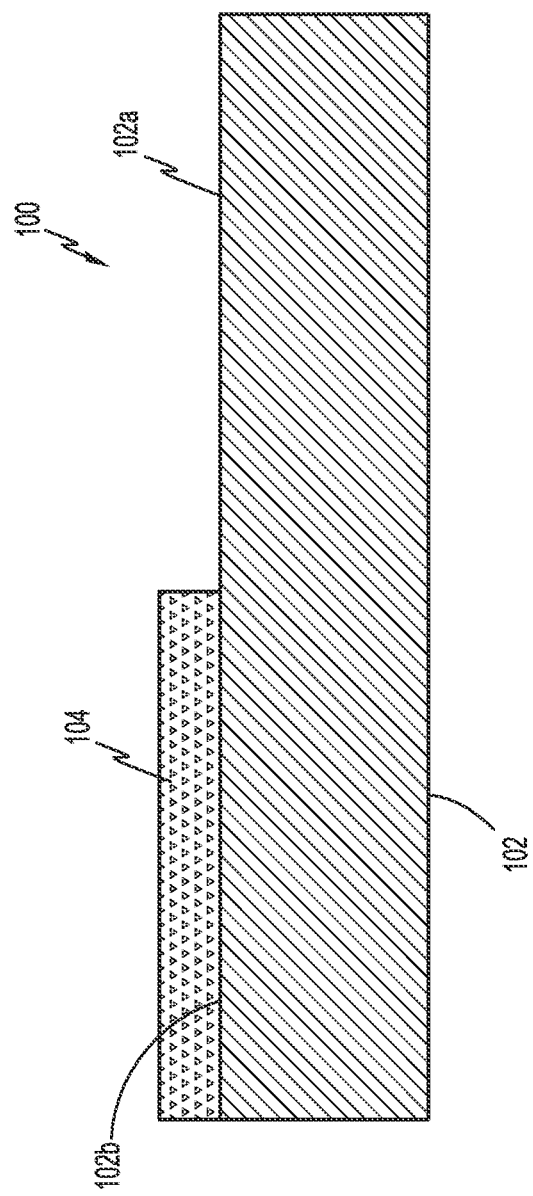
FIG. 2 is a cross-sectional view of the semiconductor structure illustrating a section of the first oxide layer removed from a first segment of the semiconductor substrate according to one or more illustrative embodiments.

Referring now to FIG. 2, the first oxide layer 104 is shown removed from a first substrate segment 102a of the semiconductor substrate 102 while being selectively retained on a second substrate segment 102b of the semiconductor substrate 102. The portion of the first oxide layer 104 over the first substrate segment 102a may be selectively removed though any number of standard conventional patterning and etching processes, including, for example, a wet etch process.

Figure 3:
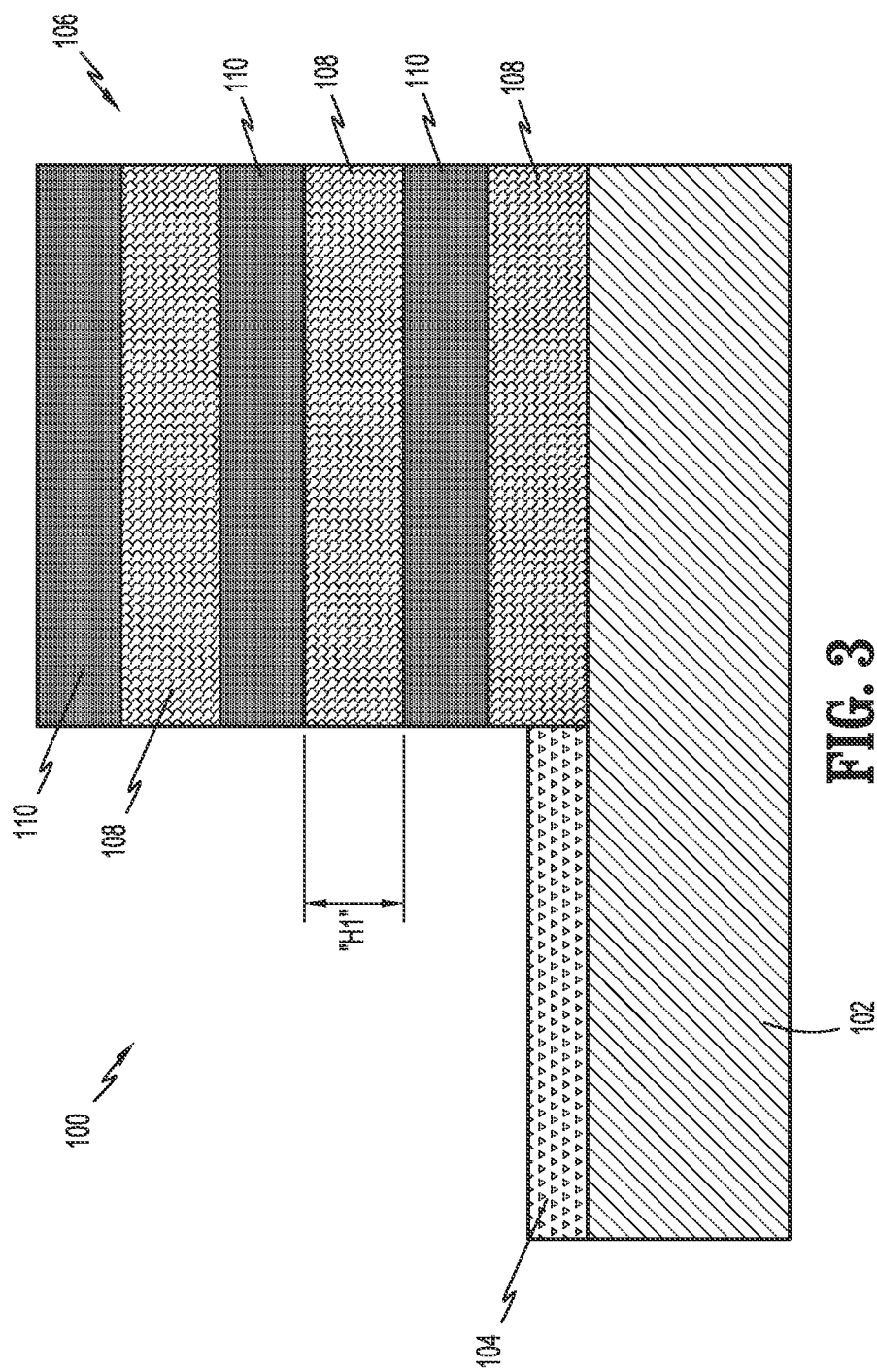
FIG. 3 is a cross-sectional view of the semiconductor structure illustrating a first nanosheet stack formed on the first segment of the semiconductor substrate according to one or more illustrative embodiments.

With reference to FIG. 3, a next process step includes developing a first nanosheet stack 106 on the first substrate segment 102a, which is devoid of the first oxide layer 104, of the semiconductor substrate 102. The first nanosheet stack 106 includes an alternating series of first sacrificial layers 108 and first channel layers 110. In illustrative embodiments, the first sacrificial layers 108 comprise silicon-germanium (SiGe) and the first channel layers 110 comprise silicon (Si). Other materials for the first sacrificial layers 108 and the first channel layers 110 are also contemplated. The first sacrificial layers 108 are "sacrificial" meaning they are substantially removed in subsequent processing steps. The first channel layers 110 will be the nanosheet layers or sheets of a nanosheet channel transistor structure subsequent to release or removal of the first sacrificial layers 108. Although the first nanosheet stack 106 is shown as including three first sacrificial layers 108 and three first channel layers 110, it should be understood that in other illustrative embodiments any number of first sacrificial layers 108 and first channel layers 110 may be used. In addition, any semiconductor material composition may be used for the first sacrificial layers 108 and the first channel layers 110 so long as at least one of the compositions selected allow for selective etching between at least two of them. More specifically, any type IV semiconductor composition combination and/or III-V semiconductor composition combination may be suitable. In addition, the thickness of the first sacrificial layers 108 are shown as being substantially equal. However, it is to be appreciated that the thicknesses of the first sacrificial layers 108 may vary. In illustrative embodiments, the height or thickness "H1" of the first sacrificial layers 108 may range from about 1 nanometer (nm) to about 30 nanometers (nm), and more particularly, may range from about 5 nanometers (nm) to about 20 nanometers (nm). The first channel layers 110 may have similar or identical thicknesses.

The first sacrificial layers 108 and the first channel layers 110 may be epitaxially grown in an alternating fashion in accordance with conventional methodologies. For example, the alternating series of the silicon germanium (SiGe) sacrificial layers 108 and the silicon (Si) channel layers 110 may be formed by epitaxially growing one layer and then the next until the desired number and desired thicknesses of the first sacrificial and channel layers 108, 110 are achieved. Epitaxial materials can be grown from gaseous or liquid precursors, and may be grown using vapor-phase epitaxy (VPE), molecular-beam epitaxy (MBE), liquid-phase epitaxy (LPE), or other suitable process. Epitaxial silicon (Si), silicon germanium (SiGe), and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor structure.

Figure 4:
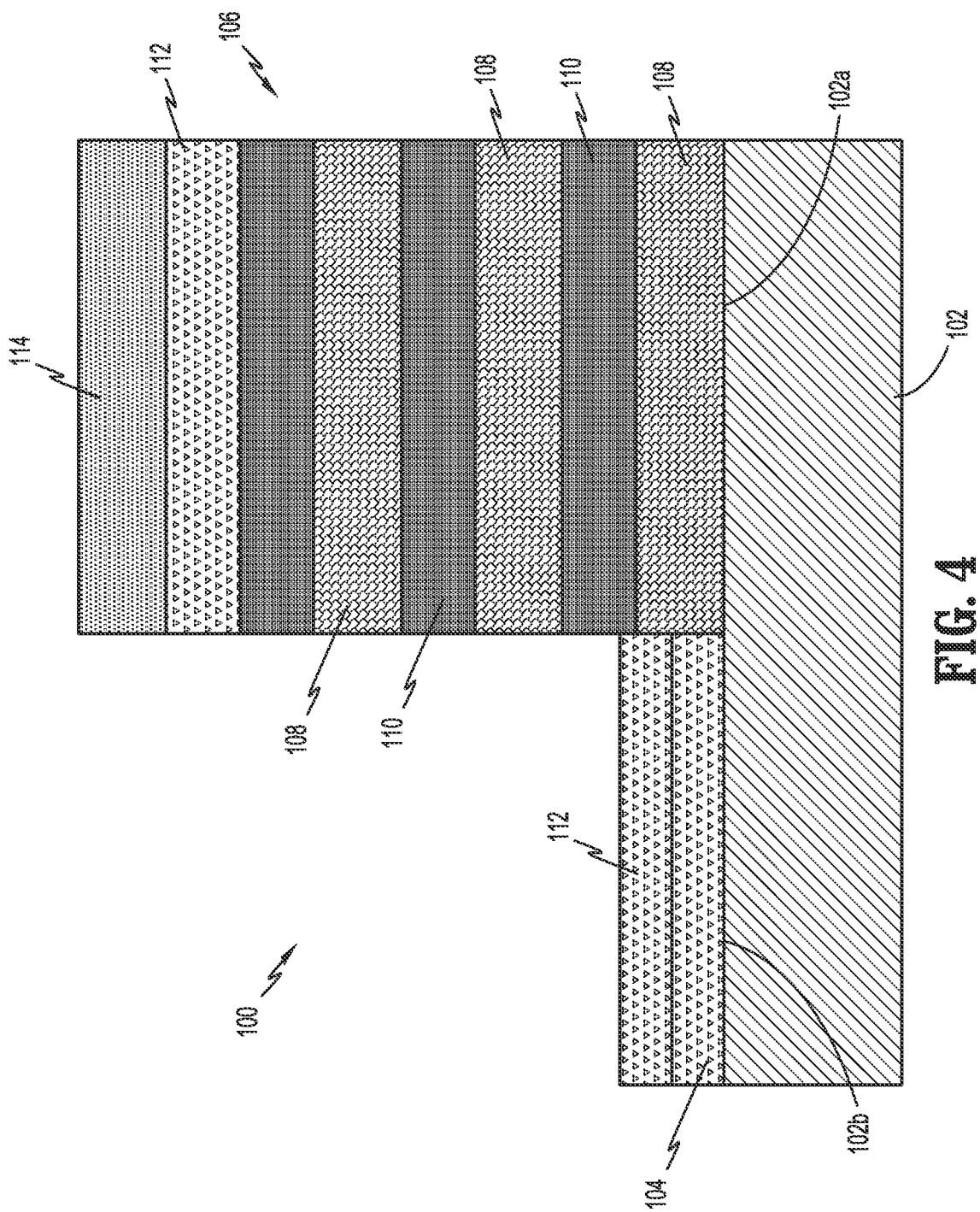
FIG. 4 is a cross-sectional view of the semiconductor structure illustrating a second oxide layer deposited on the first oxide layer and on the first nanosheet stack and a mask over the first nanosheet stack according to one or more illustrative embodiments.
Figure 5:
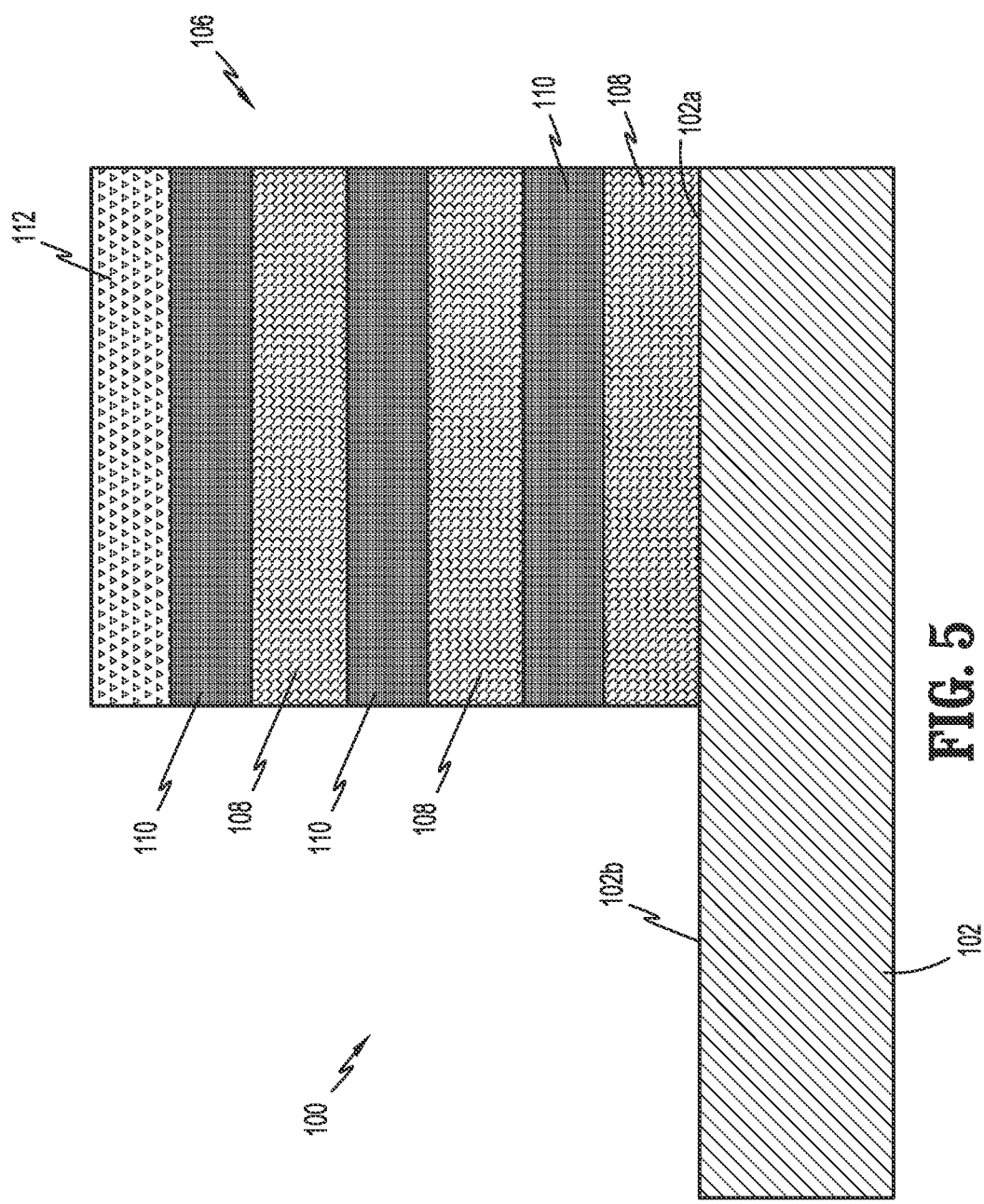
FIG. 5 is a cross-sectional view illustrating removal of the first and second oxide layers from the second segment of the semiconductor substrate according to one or more illustrative embodiments.

As depicted in FIG. 4, a second oxide layer 112 is grown on the first nanosheet stack 106 of the semiconductor substrate 102. For simplicity reasons, the second oxide layer 112 defines a single layer disposed over the first substrate segment 102a and is part of a double layer, i.e., inclusive of the first oxide layer 104, over the second substrate segment 102b of the substrate 102. The second oxide layer 112 is similar to the first oxide layer 104. Thereafter, a next process step includes positioning or forming a lithographic pattern block or hard mask 114 over the first nanosheet stack 106. Thereafter, through conventional etching processes, the first and second oxide layers 104, 112 are removed from the surface of the second substrate segment 102b of the semiconductor substrate 102 as depicted in FIG. 5. The hard mask 114 is also removed.

Figure 6:
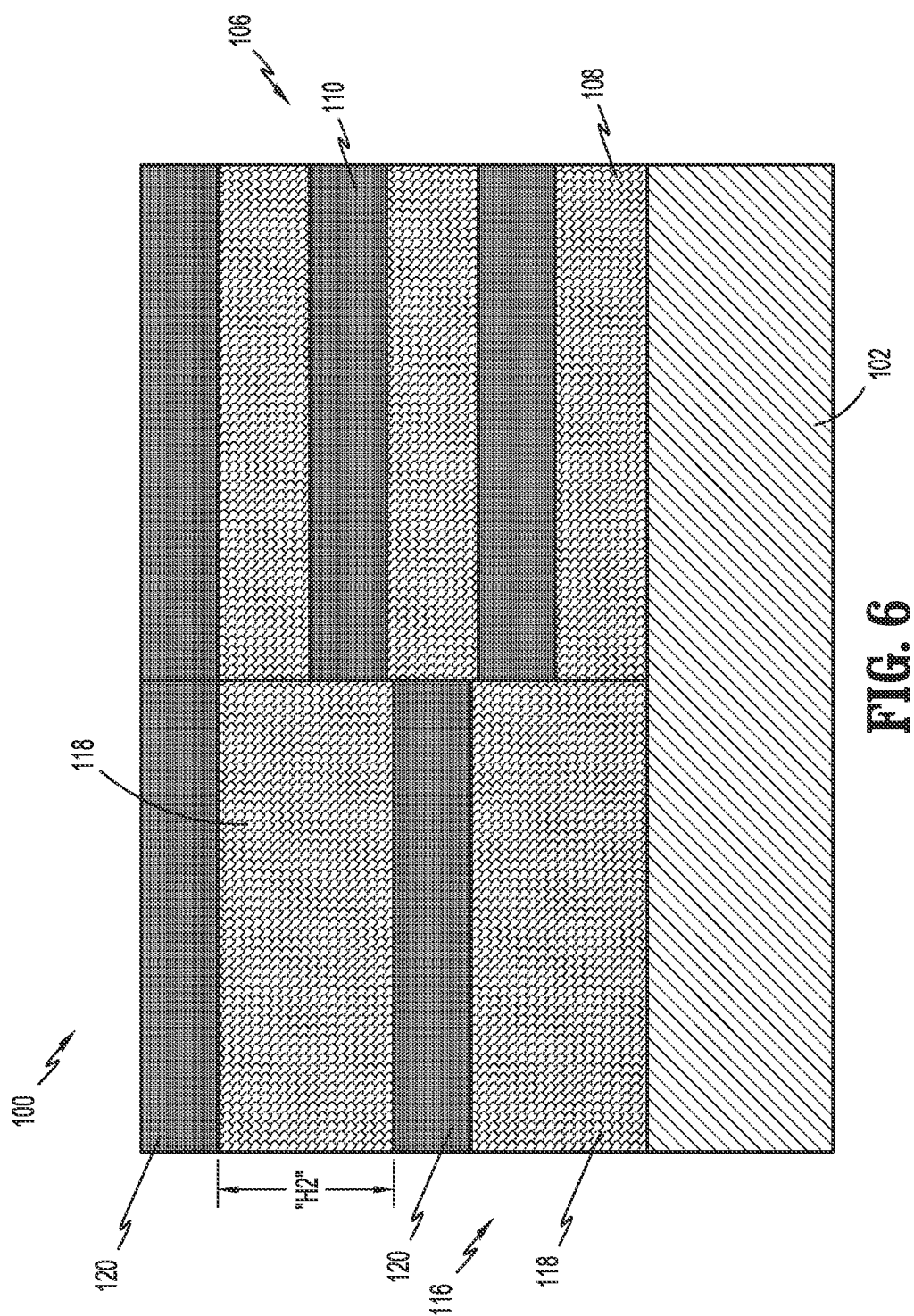
FIG. 6 is a cross-sectional view of the semiconductor structure illustrating a second nanosheet stack formed on the second segment of the semiconductor substrate according to one or more illustrative embodiments.

With reference to FIG. 6, a second nanosheet stack 116 is developed or grown onto the surface of the second substrate segment 102b. In illustrative embodiments, the second nanosheet stack 116 includes an alternating series of sacrificial layers 118 and channel layers 120. In one embodiment, the second nanosheet stack 116 includes two second sacrificial layers 118 and two second channel layers 120. Similar to the first nanosheet stack 106, the second sacrificial and second channels nanosheets 118, 120 are formed from silicon germanium (SiGe) and silicon (Si), respectively. However, the epitaxial growth process is controlled to establish a greater thickness or height "H2" of each sacrificial layer 118. The increased thickness of the second sacrificial layers 118 of the second nanosheet stack 116 will eventually, upon its removal, provide a greater volume or space for deposition of the gate dielectric as a component of an input/output (I/O) transistor structure. In illustrative embodiments, the height or thickness of the second sacrificial nanosheets 118 of the second nanosheet stack 116 may be about 125 percent (%) to about 200 percent (%) greater than the height or thickness of the first sacrificial nanosheets 108 of the first nanosheet stack 106. In addition, epitaxial growth of the second sacrificial layers 118 is controlled such that each nanosheet stack 106, 116 is substantially the same height. The second channel layers 120 may define the same thickness or height as the first channel layers 110 of the first nanosheet stack 106, or, in the alternative, be different. FIG. 6 also depicts the second oxide layer 112 removed from the first nanosheet stack 106.

Figure 7:
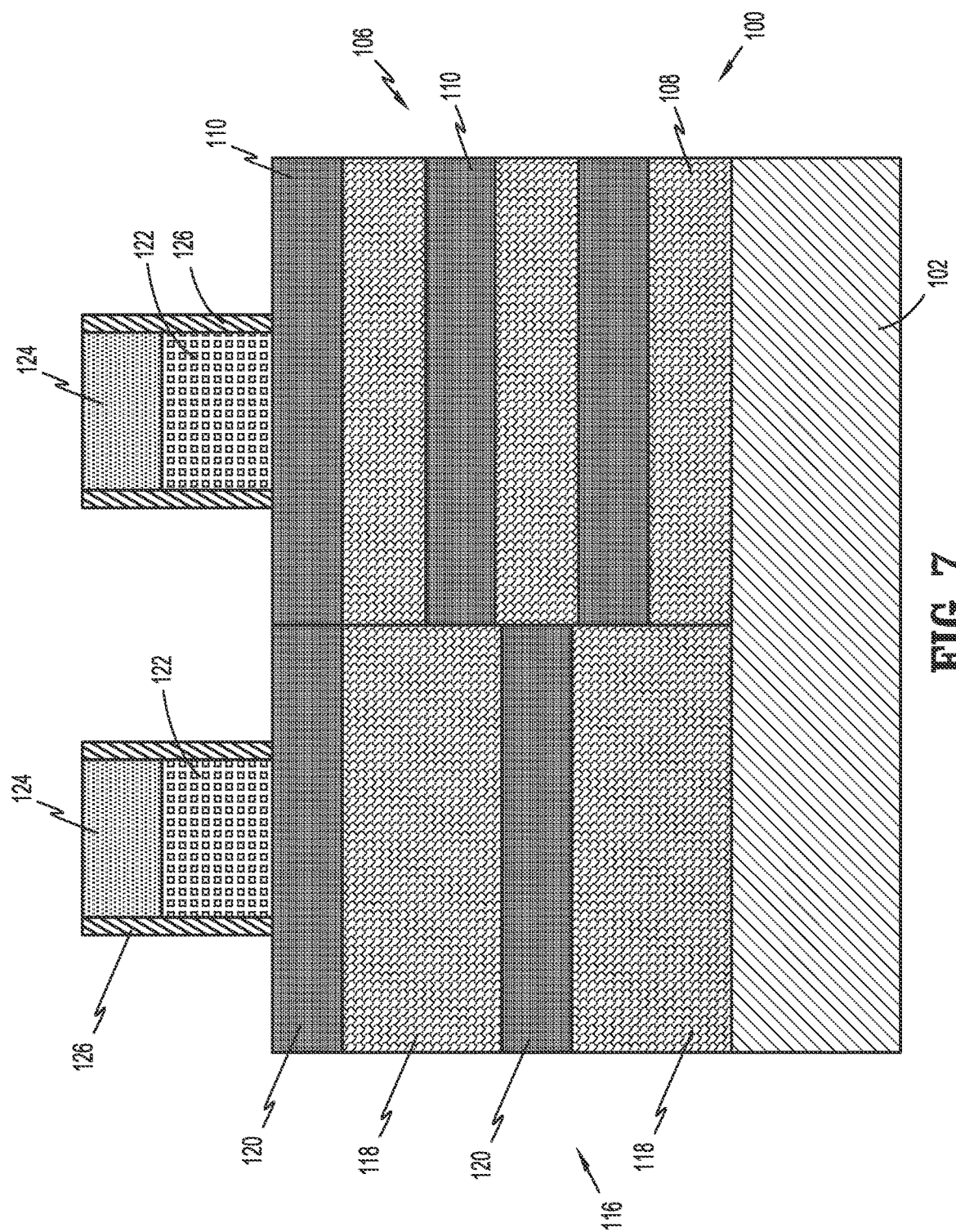
FIG. 7 illustrates formation of dummy gates on each of the first and second nanosheet stacks according to one or more illustrative embodiments.

With reference now to FIG. 7, dummy gates 122 are formed on respective uppermost first and second channel layers 110, 120 of the first and second nanosheet stacks 106, 116. The dummy gates 122 each serve as a placeholder that is subsequently removed and replaced with suitable gate materials to form a functional gate structure. The dummy gates 122 may comprise any material that can be etched selectively to the materials of the first and second sacrificial layers 108, 118 and the first and second channel layers 110, 120. One suitable material for the dummy gate 122 includes a silicon material, such as polysilicon, or any dielectric material such as an oxide, nitride or oxynitride material, or amorphous silicon. The dummy gate 122 may be formed using deposition (e.g., chemical vapor deposition), photolithography and etching processes (e.g., reactive ion etching). Hard mask layers 124 may be formed on tops of the dummy gates 122. Each hard mask layer 124 may be formed of any suitable material, e.g., a silicon nitride (SiN), that has an etch resistance greater than that of the substrate 102 and at least some of the insulator materials used in the remainder of the processing of the semiconductor structure 100. The hard mask layer 124 is used to cover/protect the first and second nanosheet stacks 106, 116 during subsequent etching processes.

A gate spacer 126 is formed around the dummy gate 122 and the hard mask layer 124. The gate spacer 126 may comprise a dielectric material, such as silicon boron carbide nitride (SiBCN), an oxide, nitride, silicon nitride (SiN), silicon oxide SO2 or other materials including low-k materials. In illustrative embodiments, the gate spacer 126 comprises silicon boron carbide nitride (SiBCN). The gate spacer 126 may be formed using a deposition process, such as chemical vapor deposition (CVD), and a reactive-ion etching (RIE) process. The gate spacer 126 may be present on the sidewalls of the dummy gate 122, and may have a wall thickness ranging from about 3 nanometers (nm) to about 15 nanometers (nm).

Figure 8:
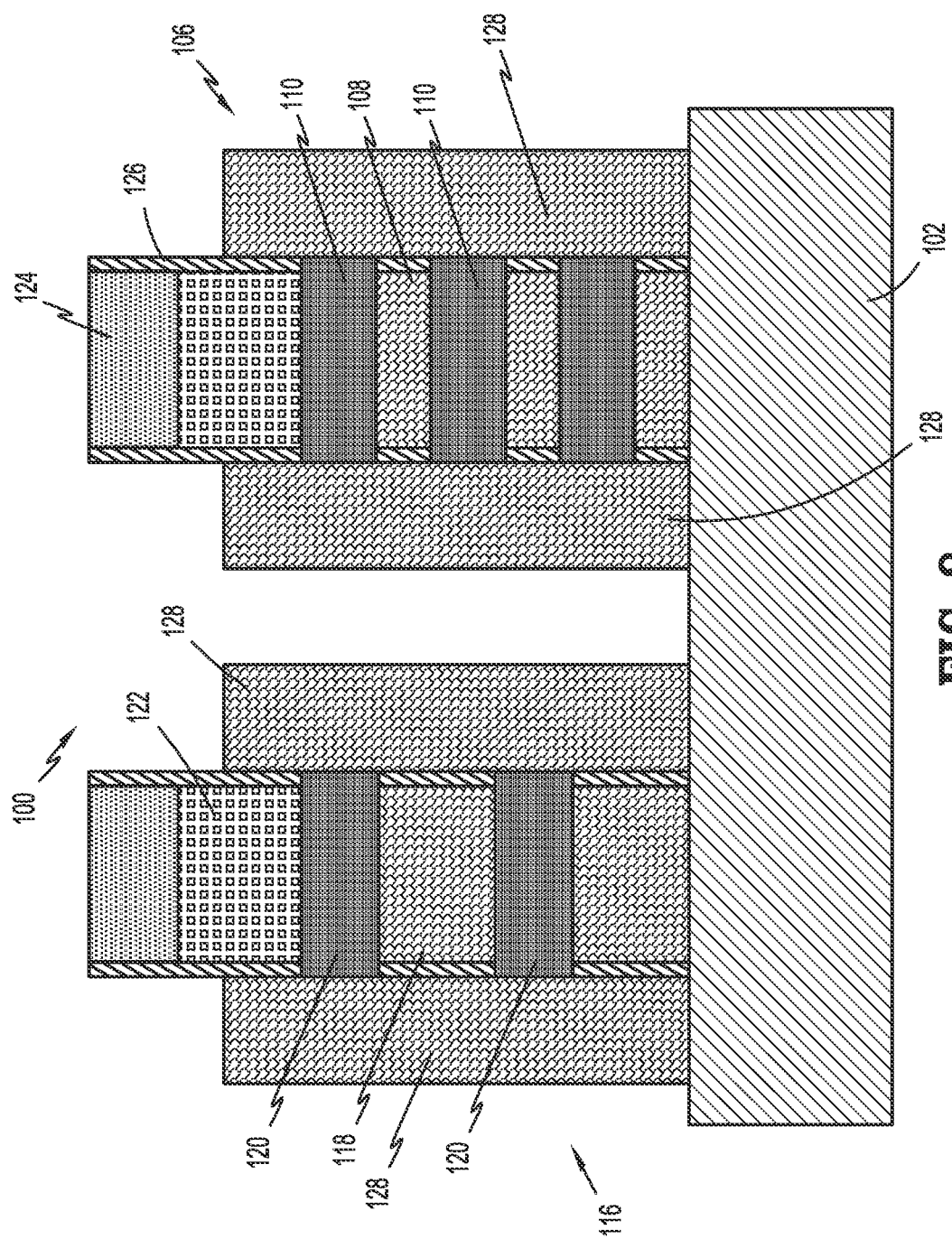
FIG. 8 is a cross-sectional view of the semiconductor structure illustrating selective removal of portions of the first and second nanosheet stacks and formation of source/drain regions about the first and second nanosheet stacks according to one or more illustrative embodiments.

Referring now to FIG. 8, the process is continued by recessing the first and second nanosheet stacks 106, 116 until the entirety of the portions of the first and second nanosheet stacks 106, 116 that extend beyond the outer sidewall of the dummy gates 122 and the gate spacer 126 are removed. In illustrative embodiments, one or more etching processes are used including, for example, an anisotropic etch process. The term "anisotropic etch process" denotes a material removal process in which the etch rate in the direction normal to the surface to be etched is greater than in the direction parallel to the surface to be etched. The anisotropic etch may include reactive-ion etching (ME). Other examples of anisotropic etching that can be used at this point of the present disclosure include ion beam etching, plasma etching or laser ablation. In illustrative embodiments, the etch process for etching the first and second nanosheet stacks 106, 116 is a timed etch.

In illustrative embodiments, the etch process for removing the portion of the first and second nanosheet stacks 106, 116 that extend beyond the outer sidewall of the gate spacer 126 may be a selective etch process. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater, e.g., 1000:1. For example, one or more etch processes may remove the exposed silicon-germanium (SiGe) material of the first and second sacrificial layers 108, 118 and the exposed silicon (Si) material of the first and second channel layers 110, 120 selectively to at least one of the materials of the gate spacers 126, the dummy gates 122 and the semiconductor substrate 102. In some embodiments, an etch block mask, such as a photoresist or hard mask, e.g., silicon nitride mask, may be formed over the dummy gates 122 during the etch process for removing the exposed portions of the first and second nanosheet stacks 106, 116.

Source and drain (S/D) regions 128 are formed using an epitaxial layer growth process on the sidewalls of the first and second nanosheet stacks 106, 116. In illustrative embodiments, the S/D regions 128 comprises epitaxial growth of silicon germanium (SiGe) similar to the material of the sacrificial layers 108, 118. Alternatively, the source/drain regions 128 may include epitaxial growth of silicon. The epitaxial growth or layers may provide at least a portion of the S/D regions 128 of the semiconductor structure 100. As used herein, the term "drain" means a doped region in a semiconductor structure located at the end of the channel region, in which carriers are flowing out of the semiconductor structure 100, e.g., nanosheet transistor structure, through the drain. The term "source" is a doped region in the semiconductor structure, in which a majority of carriers are flowing into the channel region. The S/D regions 128 can be formed by in-situ doping (doping during epitaxy) or ex-situ, or a combination of in-situ doping and ex-situ doping. Doping techniques may include but, are not limited to, ion implantation, gas phase doping, plasma doping, plasma immersion ion implantation, cluster doping, infusion doping, liquid phase doping, solid phase doping, and/or any suitable combination of those techniques. In some embodiments, dopants are activated by thermal annealing such as laser annealing, flash annealing, rapid thermal annealing (RTA) or any suitable combination of those techniques.

Epitaxial growth or deposition of the S/D regions 128 may be carried out in a chemical vapor deposition apparatus, such as a metal organic chemical vapor deposition (MOCVD) apparatus or a plasma enhanced chemical vapor deposition (PECVD) apparatus. The epitaxial semiconductor S/D regions 128 may be in situ doped to a p-type or n-type conductivity. The term "in situ" denotes that a dopant, e.g., p-type or n-type dopant, is introduced to the base semiconductor material, e.g., silicon or silicon germanium, during the formation of the base material. In one illustrative embodiment, for a p-type conductivity, boron p-type dopants are introduced into the epitaxial growth of silicon germanium and, for an n-type conductivity, phosphorous n-type dopants are introduced into the epitaxial growth of silicon.

Figure 9:
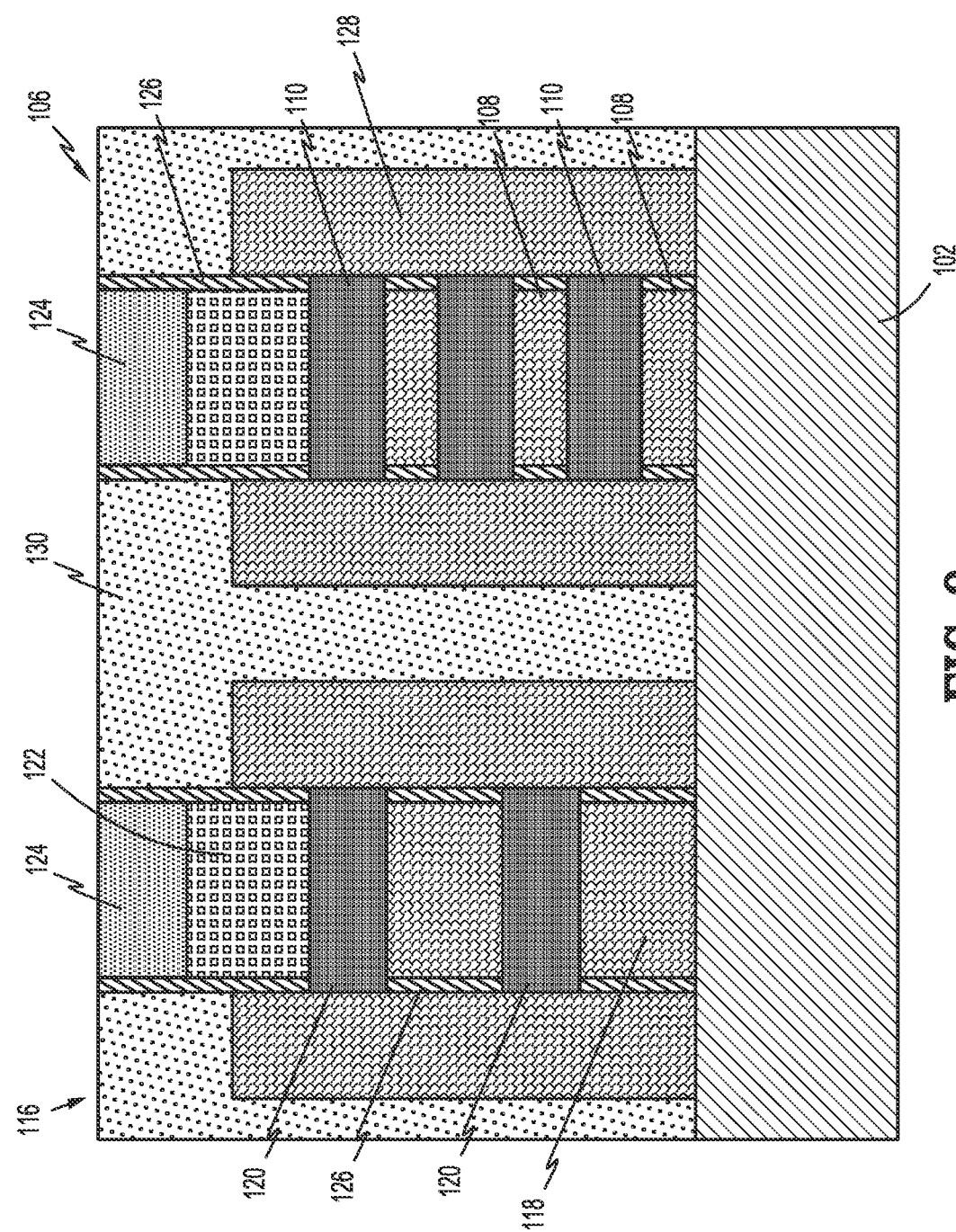
FIG. 9 is a cross-sectional view of the semiconductor structure illustrating deposition of an interlayer dielectric about the first and second nanosheet stacks, the source/drain regions and the dummy gates according to one or more illustrative embodiments.

FIG. 9 illustrates deposition of an inter-layer dielectric (ILD) 130 onto the semiconductor substrate 102 to at least partially encompass the first and second nanosheet stacks 106, 116, the S/D regions 128 and the dummy gate 122. In illustrative embodiments, the inter-layer dielectric (ILD) 130 is an oxide layer. In various embodiments, a height of the inter-layer dielectric (ILD) 130 can be reduced by chemical-mechanical polishing (CMP) and/or etching to expose the hard mask 124 and the dummy gates 122. Other suitable dielectric materials for forming the inter-layer dielectric (ILD) 130 include, but are not limited to, silicon oxide, silicon nitride, silicon oxynitride, SiCO, SiCON, or any suitable combination of such materials.

Figure 10:
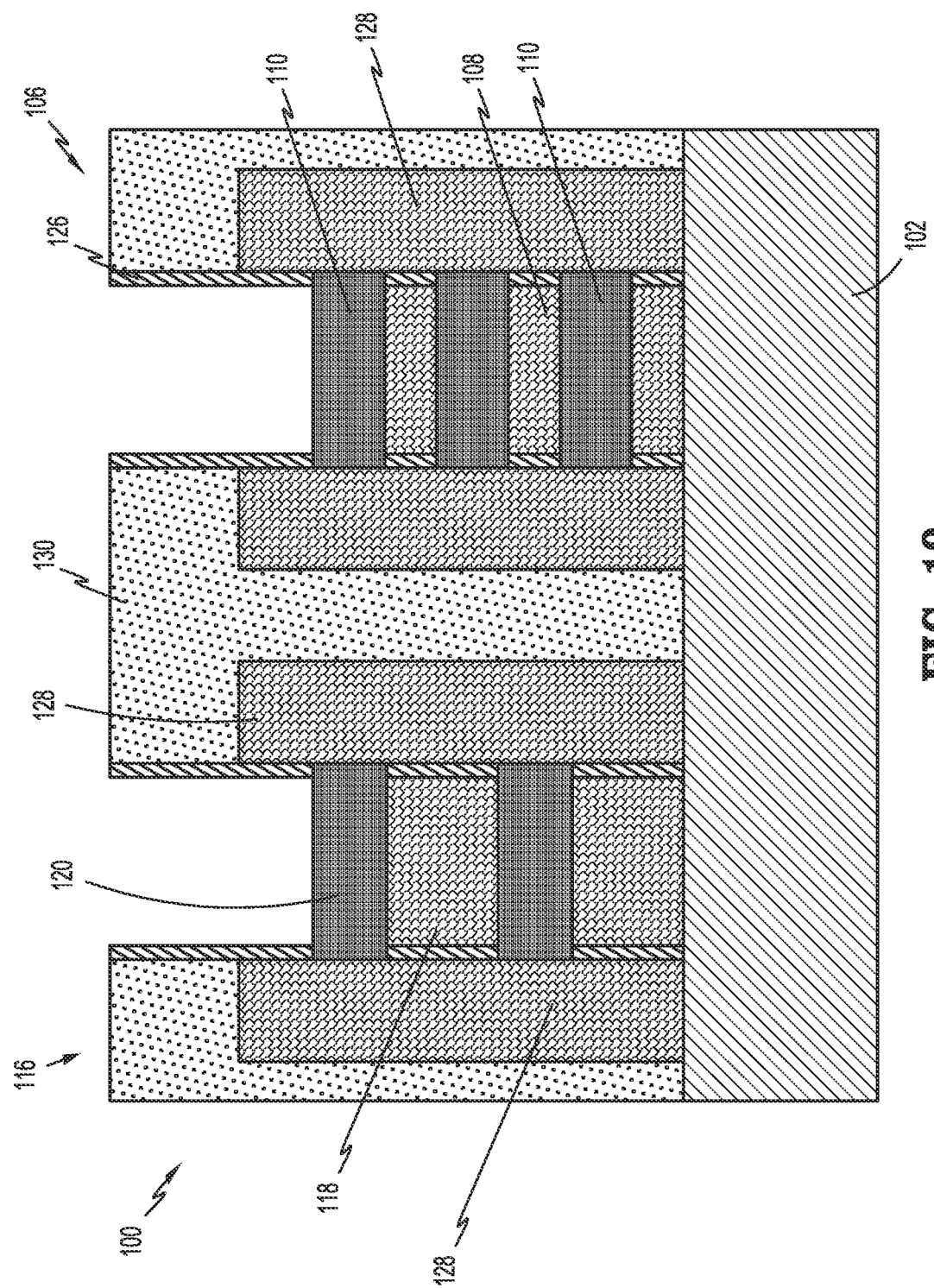
FIG. 10 is a cross-sectional view of the semiconductor structure illustrating removal of the dummy gates from the first and second nanosheet stacks according to one or more illustrative embodiments.

Thereafter, the hard mask layers 124 and the dummy gates 122 are removed as shown in FIG. 10. In illustrative embodiments, removal of the dummy gates 122 may be effected using a wet or dry etch process. More specifically, the dummy gates 122 may be removed by at least one of an anisotropic etch process, such as reactive ion etch (RIE), or an isotropic etch process, such as a wet chemical etch, or a combination of both. Upon removal of the dummy gates 122 openings exposing the underlying first and second nanosheet stacks 106, 116 are formed.

Figure 11:
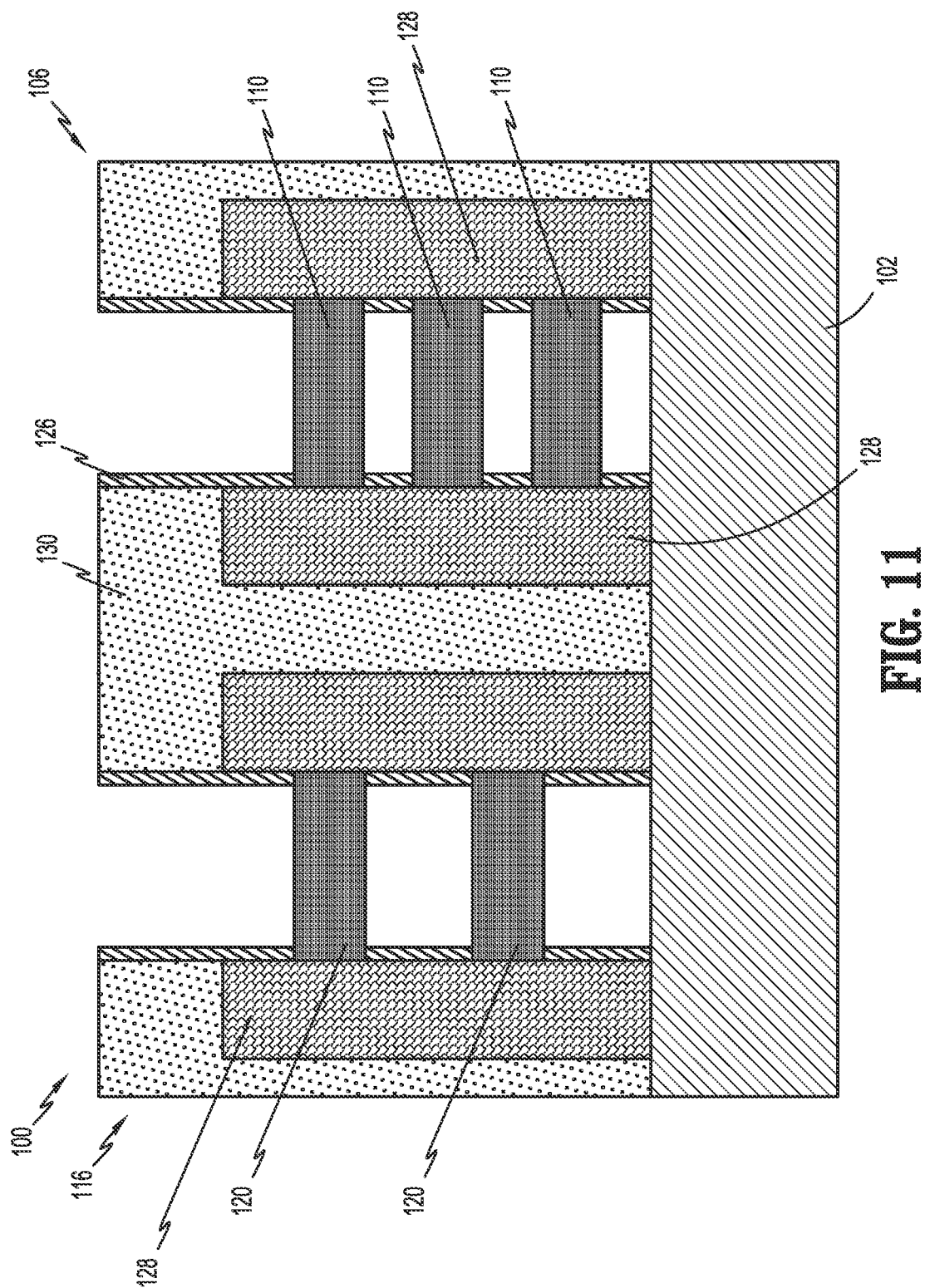
FIG. 11 is a cross-sectional view of the semiconductor structure illustrating removal of the first and second sacrificial layers of the first and second nanosheet stacks to release the respective first and second channel layers according to one or more illustrative embodiments.

With reference to FIG. 11, following removal of the dummy gates 122, the first and second sacrificial layers 108, 118 comprising silicon germanium are removed selectively from the first and second channel layers 110, 120 of each of the first and second nanosheet stacks 106, 116. In illustrative embodiments, the first and second sacrificial layers 108, 118 of the respective first and second nanosheet stacks 106, 116 may be removed sequentially or simultaneously via a conventional lithography and etching processes. Upon removal of the first and second sacrificial layers 108, 118, the first and second channel layers 110, 120 of the first and second nanosheet stacks 106, 116 are released. The silicon first and second channel layers 110, 120 when released from the silicon germanium first and second sacrificial layers 108, 118 will form the nanosheet channels of the nanosheet transistor structures of the semiconductor device 100. In this example, following removal of one of the sacrificial layers 108, 118, suspended channel structures are provided. By "suspended channel" it is meant that the channel layers 110, 120 are present overlying the substrate 102. The sidewalls of the channel layers 110, 120 are supported, e.g., anchored, in the gate spacers 126.

As best depicted in FIG. 11, the voids left by removal of the two second sacrificial layers 118 of the second nanosheet stack 116 are greater in height "H" than the voids left by removal of the three first sacrificial layers 108 of the first nanosheet stack 106. More specifically, removal of the second sacrificial layers 118 from the second nanosheet stack 116 provides an increased volume of empty space due, at least in part to the increased volume or height "H2" (FIG. 6) of the second sacrificial layers 118 relative to the height "H1" (FIG. 3) of the first sacrificial layers, and the decreased number of remaining second channel layers 120, i.e., two second channel layers 120 when compared to the first nanosheet stack 106, i.e., three first channel layers 110. The excess space or void will enable the deposition of a thick oxide material within the second nanosheet stack 116 whereby the second nanosheet stack 116 may function as an input/output transistor structure. FIG. 11 illustrates three suspended second channel layers 110 of the first nanosheet stack 106 and two suspended first channel layers 120 of the second nanosheet stack 116. The distance between the channel layers 110 of the first nanosheet stack 106 may be about twelve nanometers (nm) and the distance between the channel layers 120 of the second nanosheet stack 116 may be about 14 nanometers (nm). Other dimensions are also contemplated.

Figure 12:
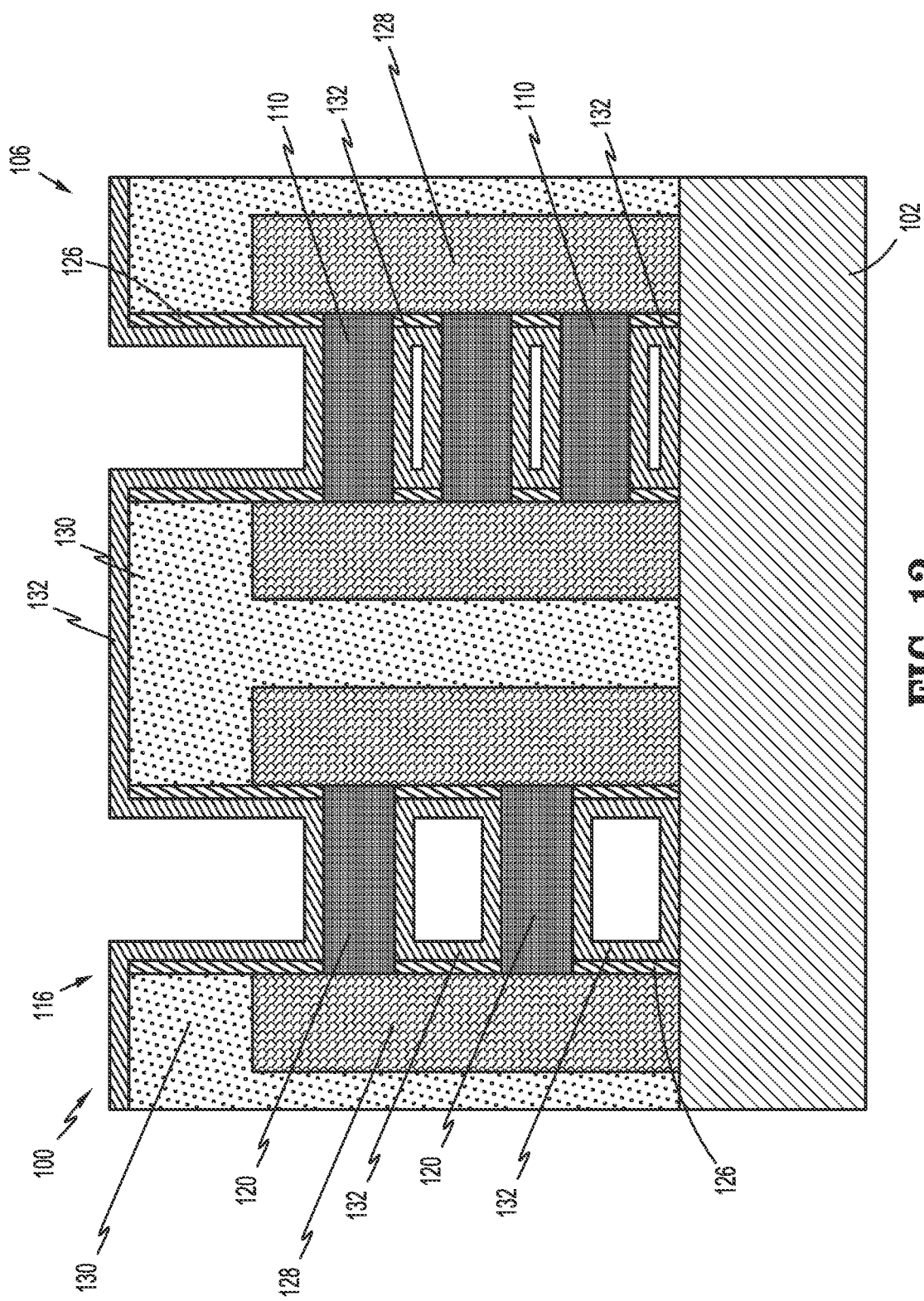
FIG. 12 is a cross-sectional view of the semiconductor structure illustrating deposition of a thick oxide layer within the first and second nanosheet stacks according to one or more illustrative embodiments.

FIG. 12 illustrates a thick dielectric or oxide 132 deposition over the first nanosheet stack 106 and the second nanosheet stack 116. In various illustrative embodiments, the thick oxide 132 may result in gaps within the channels of the first and second nanosheet stacks 106, 116. The gaps will eventually be filled with a high-k dielectric, metal gate films and/or a work function metal during formation of the gate structure. In illustrative embodiments, oxide pinch-off may occur in the second nanosheet stack 116 whereby the thick oxide 132 pinches off a section of the gate spacer 126 such that the thick oxide 132 may contact the S/D regions 128, i.e., the pinched off thick oxide 132 becomes part of, or merges with, the gate spacer 126. Stated differently, the pinched off oxide 132 may result in a physical connection between the thick oxide 132 and the S/D regions 128.

The thick oxide 132 can be deposited by atomic layer deposition (ALD) techniques including plasma enhanced atomic layer deposition (PEALD) processes. ALD is a gas phase chemical process used to create extremely thin coatings. In illustrative embodiments, the thick oxide 132 is deposited at deposition temperatures ranging from about 385° C. to 425° C. A non-limiting thickness of the thick oxide can be about 3-6 nm. In illustrative embodiments, at least the thick oxide 132 deposited about the second nanosheet stack 116 may be subjected to some additional treatments including, but not limited to plasma nitration, plasma oxidation (RT to 450°), annealing processes including spike annealing processes at temperatures ranging from about 800° to 950° C. and/or soak annealing processes at temperatures ranging from about 700° to 800° C. In addition, it is further contemplated that the thick oxide 132 may be subject to additional treatments including low energy pulse wave plasma (radiofrequency (RF) and microwave) nitration with N atomic % ranging from 5 atomic % to 20 atomic %. This treatment may be followed by the aforementioned SPIKE or SOAK anneal processes at the parameters indicated hereinabove and a plasma oxidation process with helium (at a low energy, pulse wave). These additional treatments densify PEALD and ALD deposited oxides (e.g., thick oxide 132) making them generally equivalent to thermal oxides.

Figure 13:
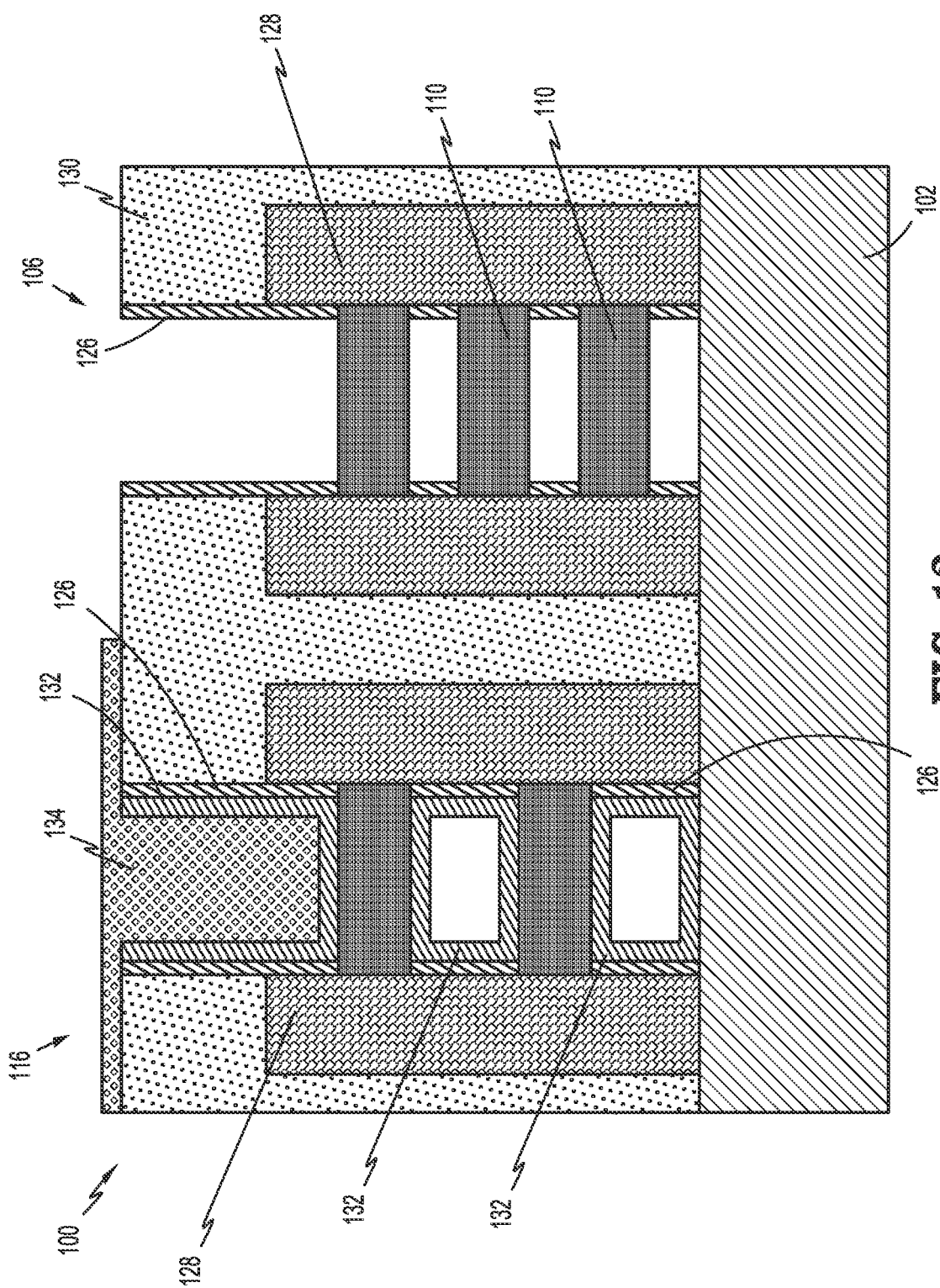
FIG. 13 is a cross-sectional view of the semiconductor structure illustrating deposition of a block mask over the second nanosheet stack and removal of the thick oxide layer from the first nanosheet stack according to one or more illustrative embodiments.

Referring now to FIG. 13, the process is continued by positioning a block mask 134 over the second nanosheet stack 116 and removing the thick oxide 132 from the first nanosheet stack 106 through conventional lithographic and etching processes.

Figure 14:
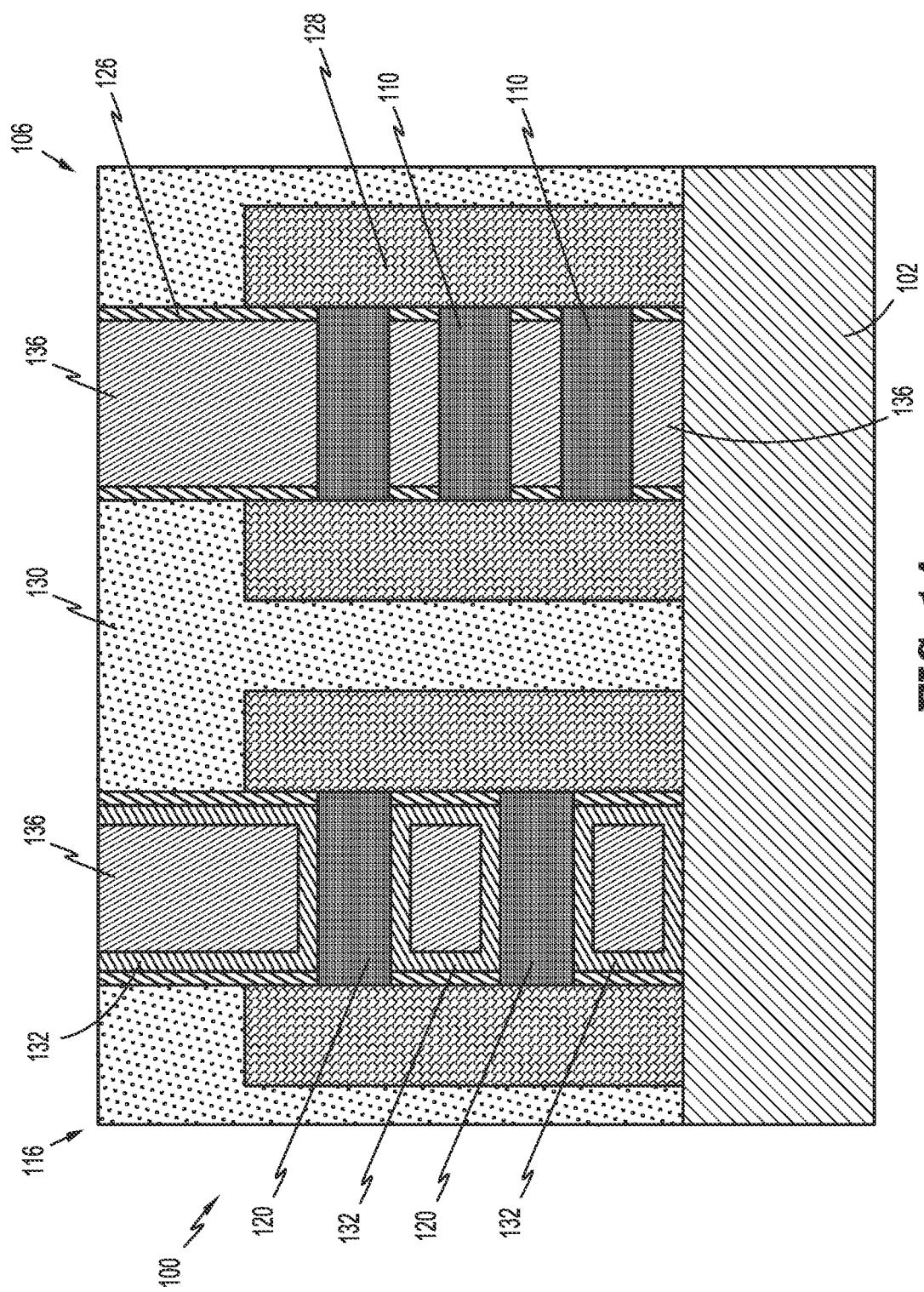
FIG. 14 is a cross-sectional view of the semiconductor structure illustrating deposition of a high-k/metal gate structure within each nanosheet stack according to one or more illustrative embodiments.

With reference to FIG. 14, a high-k/metal gate 136 is formed around the first and second channel layers 110, 120 of the first and second nanosheet stacks 106, 116 and within the voids left by removal of the dummy gates 122. For example, a high-k dielectric material can be deposited to form the gate dielectric. The gate dielectric can be formed on the entirety of the exterior surface of the suspended first and second channel layers 110, 120. The gate dielectric may comprise a semiconductor oxide, semiconductor nitride, semiconductor oxynitride, or a high-k material having a dielectric constant greater than silicon oxide. The gate dielectric can be formed by chemical vapor deposition (CVD), such as plasma enhanced chemical vapor deposition (PECVD), metal organic chemical vapor deposition (MOCVD), or atomic layer deposition (ALD). Examples of gate dielectric material(s) can comprise any suitable dielectric material, including but not limited to silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum, magnesium. The gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. In some embodiments, the gate dielectric has a thickness ranging from 1 nm to 5 nm, although less thickness and greater thickness are also conceived.

A metal liner, e.g., a work-function metal, and a gate metal can then be deposited on the dielectric material filling the void to complete the functional gate structure. In one or more embodiments, the metal liner can be, for example, TiN or TaN, and the gate metal or conductor may comprise an elemental metal (e.g., tungsten, titanium, tantalum, aluminum, nickel, ruthenium, palladium and platinum), an alloy of at least one elemental metal, an elemental metal nitride (e.g., tungsten nitride, aluminum nitride, and titanium nitride), an elemental metal silicide (e.g., tungsten silicide, nickel silicide, and titanium silicide) and multilayered combinations thereof. The gate metal can be formed utilizing a deposition process including, for example, chemical vapor deposition (CVD), plasma enhanced chemical vapor deposition (PECVD), physical vapor deposition (PVD), sputtering, atomic layer deposition (ALD) and other like deposition processes.

FIG. 14 depicts one embodiment of a semiconductor structure 100 that may include nanosheet transistor structures including the suspended channel structure of the channel layers 110, 120 of the first and second nanosheet stacks 106, 116. The first nanosheet transistor structure including the first nanosheet stack 106 having three first channel layers 108 may be "a small gate nanosheet transistor structure" utilized in a lower voltage device, e.g., up to about 1 volt, such as any suitable logic device. The second nanosheet transistor structure including the second nanosheet stack 116 having the two channel layers 120 and thick oxide 132 may be an "extended gate nanosheet transistor structure" utilized in a higher voltage device, e.g., up to about 2 volts, such as input/output circuits.

The incorporation of three first channel layers 110 for the small gate dielectric transistor structure and two second channel layers 120 for the extended or thick gate dielectric transistor structure on a single semiconductor substrate 100 is just an example. The small gate dielectric transistor structure may have four channel layers or sheets (a top layer, a bottom layer, and two middle layers), while the thick dielectric transistor structure may have two channel layers or sheets (with top sheet and bottom sheet remaining, the middle two sheets may be are converted to oxide and removed). In another example, the thin gate dielectric transistor structure may have five channel sheets (from top to bottom, sheets 1, 2, 3, 4, 5). The thick gate dielectric transistor structure may have only three channel layers or sheets with sheets two and four removed. Other arrangements are also contemplated.

Therefore, thin, e.g., small and thick, e.g., extended gate, dielectric transistor structures can be compatible on a single chip. The small gate dielectric transistor structure may be used for digital logic and static random-access memory (SRAM) up to a voltage of around 1 volt, whereas the extended or thick gate dielectric transistor structure may be used for high voltage applications including input/output devices at a voltage up to at least 2 volts.

The first and second channel layers 110, 120 in the thin and extended gate dielectric transistor structures are coplanar, thus avoiding any topography issues, and at the same height or level. The gap between the second channel layers 120 of the extended dielectric transistor structure are widened relative to the channel layers 110 of the small dielectric transistor structure by selectively reducing the number of second channel layers 118 and increasing the height or thickness of the second sacrificial layers 118 of the second nanosheet stack 116 forming the extended dielectric transistor structure. Oxide pinch off also may occur in the extended gate dielectric nanosheet transistor structure such that sections of the gate spacer 126 are eliminated to allow the pinched off oxide region or area to directly contact source and/or drain regions.

In some embodiments, the above-described techniques are used in connection with manufacture of nanosheet transistor structures for semiconductor integrated circuit devices that illustratively comprise, by way of non-limiting example, CMOS devices, MOSFET devices, and/or FinFET devices, and/or other types of semiconductor integrated circuit devices that incorporate or otherwise utilize CMOS, MOSFET, and/or FinFET technology.

Semiconductor devices and methods for forming same in accordance with the above-described techniques can be employed in various applications, hardware, and/or electronic systems, including but not limited to personal computers, communication networks, electronic commerce systems, portable communications devices (e.g., cell and smart phones), solid-state media storage devices, functional circuitry, etc. Given the teachings provided herein, one of ordinary skill in the art will be able to contemplate other implementations and applications of embodiments of the invention.

Accordingly, at least portions of one or more of the semiconductor structures described herein may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

In some embodiments, the suspended nanosheets channel structures may be further processed to provide nanowires. For example, a nanowire geometry can be produced from the suspended channel structures using etch processing, such as isotropic etch processing.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device, comprising:
a first nanosheet transistor structure disposed on a semiconductor substrate, the first nanosheet transistor structure including a first nanosheet stack having a first number of first channel layers with adjacent ones of the first channel layers being spaced a first predetermined distance; and
a second nanosheet transistor structure disposed on the semiconductor substrate, the second nanosheet transistor structure including a second nanosheet stack having a second number of second channel layers with adjacent ones of the second channel layers being spaced a second predetermined distance;
wherein the first number of the first channel layers is greater than the second number of the second channel layers;
wherein the second predetermined distance is greater than the first predetermined distance;
wherein a second channel layer that is closest to the semiconductor substrate among the second channel layers is spaced farther from a top surface of the semiconductor substrate than a first channel layer that is closest to the semiconductor substrate among the first channel layers;
wherein the first and second nanosheet transistor structures each include:
a plurality of gate structures respectively comprising at least a gate dielectric layer and a metal gate on the gate dielectric layer;
a plurality of source/drain regions on sides of the first and second nanosheet transistor structures; and
a plurality of dielectric spacers disposed between the plurality of gate structures and the plurality of source/drain regions; and
wherein the second nanosheet transistor structure further includes a plurality of oxide layers disposed around the plurality of gate structures of the second nanosheet transistor structure, wherein a portion of the plurality of oxide layers contacts one or more of the plurality of source/drain regions of the second nanosheet transistor structure.

2. The semiconductor device of claim 1 wherein the first and second nanosheet stacks are the same height.

3. The semiconductor device of claim 1 wherein the first nanosheet stack includes three of the first channel layers and the second nanosheet stack includes two of the second channel layers.

4. The semiconductor device of claim 1 wherein a height of each of the second channel layers is different from a height of each of the first channel layers.

5. The semiconductor device of claim 1 wherein a height of each of the second channel layers is equal to a height of each of the first channel layers.

6. The semiconductor device of claim 1 wherein the first and second nanosheet transistor structures are each gate dielectric nanosheet transistor structures.

7. The semiconductor device of claim 1 wherein one or more segments of the plurality of oxide layers are in contact with the plurality of gate structures of the second nanosheet transistor structure.

8. The semiconductor device of claim 1 wherein one or more segments of the plurality of oxide layers are disposed between the adjacent ones of the second channel layers of the second nanosheet stack.

9. The semiconductor device of claim 1 wherein one or more segments of the plurality of oxide layers are disposed beneath the plurality of gate structures of the second nanosheet transistor structure.

10. A semiconductor device, comprising:
at least one nanosheet transistor structure disposed on a semiconductor substrate, the at least one nanosheet transistor structure including:
a first nanosheet stack having a plurality of first channel layers;
a first source region and a first drain region;
a first metal gate disposed about the at least one nanosheet transistor structure; and
an oxide layer disposed relative to the first metal gate, the oxide layer comprising one or more segments disposed between the first metal gate and the first source and first drain regions; and
a second nanosheet transistor structure disposed on the semiconductor substrate, the second nanosheet transistor structure including a second nanosheet stack having a plurality of second channel layers;
wherein a first channel layer that is closest to the semiconductor substrate among the plurality of first channel layers is spaced farther from a top surface of the semiconductor substrate than a second channel layer that is closest to the semiconductor substrate among the plurality of second channel layers;
wherein the first nanosheet stack further includes a plurality of dielectric spacers disposed between the one or more segments of the oxide layer and the first source and first drain regions; and
wherein a portion of the one or more segments of the oxide layer contacts at least one of the first source and first drain regions.

11. The semiconductor device of claim 10 wherein the one or more segments of the oxide layer are disposed between adjacent ones of the plurality of first channel layers of the first nanosheet stack.

12. The semiconductor device of claim 10 wherein the oxide layer comprises one or more additional segments disposed below the first metal gate.

13. The semiconductor device of claim 10 wherein the second nanosheet transistor structure further includes:
a second source region and a second drain region; and
a second metal gate.

14. The semiconductor device of claim 10 wherein the first and second nanosheet stacks are the same height.

15. The semiconductor device of claim 10 wherein the one or more segments of the oxide layer are in contact with the first metal gate.

16. The semiconductor device of claim 12 wherein the one or more additional segments of the oxide layer are in contact with the first metal gate.

17. A semiconductor device, comprising:
first and second nanosheet FET devices positioned on a semiconductor substrate, each of the first and second nanosheet FET devices respectively including a plurality of first channel members and a plurality of second channel members above the semiconductor substrate, a first gate structure and a second gate structure, a first source region and a second source region, and a first drain region and a second drain region;
wherein a number of the plurality of first channel members is greater than a number of the plurality of second channel members;
wherein the second nanosheet FET device includes an oxide layer having one or more oxide segments, the one or more oxide segments disposed between adjacent ones of the plurality of second channel members, between the second gate structure and the semiconductor substrate, and between the second gate structure and the second source and second drain regions;
wherein a second channel member that is closest to the semiconductor substrate among the plurality of second channel members is spaced farther from a top surface of the semiconductor substrate than a first channel member that is closest to the semiconductor substrate among the plurality of first channel members;
wherein the second nanosheet FET device further includes a plurality of dielectric spacers disposed between the one or more oxide segments and the second source and second drain regions; and
wherein a portion of the one or more oxide segments contacts at least one of the second source and second drain regions.

18. The semiconductor device of claim 17 wherein a height of each of the plurality of second channel members is equal to a height of each of the plurality of first channel members.

19. The semiconductor device of claim 17 wherein the one or more oxide segments are in contact with the second gate structure.

20. The semiconductor device of claim 17 wherein the first nanosheet FET device includes three of the first channel members and the second nanosheet FET device includes two of the second channel members.

* * * * *